(12) United States Patent
Yamada (10) Patent No.: US 9,006,787 B2
(45) Date of Patent: Apr. 14, 2015

(54) SEMICONDUCTOR DEVICE INCLUDING GATE ELECTRODE PROVIDED OVER ACTIVE REGION IN P-TYPE NITRIDE SEMICONDUCTOR LAYER AND METHOD OF MANUFACTURING THE SAME, AND POWER SUPPLY APPARATUS

(71) Applicant: Transphorm Japan, Inc., Yokohama, Kanagawa (JP)

(72) Inventor: Atsushi Yamada, Kawasaki (JP)

(73) Assignee: Transphorm Japan, Inc., Yokohama (JP)

( * ) Notice: Subject to any disclaimer, the term of this patent is extended or adjusted under 35 U.S.C. 154(b) by 0 days.

(21) Appl. No.: 14/067,928

(22) Filed: Oct. 30, 2013

(65) Prior Publication Data

US 2014/0054606 A1 Feb. 27, 2014

Related U.S. Application Data

(62) Division of application No. 13/308,686, filed on Dec. 1, 2011, now Pat. No. 8,603,880.

(30) Foreign Application Priority Data

Feb. 17, 2011 (JP) ................................. 2011-032042

(51) Int. Cl.
*H01L 31/0256* (2006.01)
*H01L 29/778* (2006.01)
(Continued)

(52) U.S. Cl.
CPC .......... *H01L 29/778* (2013.01); *H01L 29/2003* (2013.01); *H01L 29/42364* (2013.01); *H01L 29/66462* (2013.01); *H01L 29/7783* (2013.01); *H01L 29/7787* (2013.01)

(58) Field of Classification Search
CPC ..................... H01L 29/2003; H01L 29/42364; H01L 29/778; H01L 29/7783; H01L 29/7787; H01L 29/66462
USPC ..................... 257/76, 192, 191, 194, E21.131, 257/E21.441, E29.296, E29.249, E21.452, 257/E21.407, E29.091, E29.246
See application file for complete search history.

(56) References Cited

U.S. PATENT DOCUMENTS 6,534,801 B2   3/2003  Yoshida
8,129,748 B2 *  3/2012  Uemoto et al. ............... 257/192
(Continued)

FOREIGN PATENT DOCUMENTS

CN         1212297       3/1999
CN         101692444     4/2010
(Continued)

OTHER PUBLICATIONS

"Hydrogen in GaN," Proceedings of the First Symposium on III-V, Nitride Materials and Processes, vol. 96, No. 11, pp. 95-99 (1996).
(Continued)

*Primary Examiner* — Yu-Hsi D Sun
*Assistant Examiner* — Christina Sylvia
(74) *Attorney, Agent, or Firm* — Fish & Richardson P.C.

(57) ABSTRACT

A semiconductor device includes a nitride semiconductor stacked structure including a carrier transit layer and a carrier supply layer; a p-type nitride semiconductor layer provided over the nitride semiconductor stacked structure and including an active region and an inactive region; an n-type nitride semiconductor layer provided on the inactive region in the p-type nitride semiconductor layer; and a gate electrode provided over the active region in the p-type nitride semiconductor layer.

24 Claims, 8 Drawing Sheets (51) Int. Cl.
*H01L 29/20* (2006.01)
*H01L 29/423* (2006.01)
*H01L 29/66* (2006.01)

(56) References Cited

U.S. PATENT DOCUMENTS

| | | | |
|---|---|---|---|
| 8,603,880 B2 | 12/2013 | Yamada | |
| 2002/0187568 A1* | 12/2002 | Stockman | 438/22 |
| 2007/0057350 A1* | 3/2007 | Otremba | 257/666 |
| 2007/0228415 A1* | 10/2007 | Kanamura et al. | 257/192 |
| 2009/0121775 A1 | 5/2009 | Ueda et al. | |
| 2010/0110641 A1* | 5/2010 | Okahashi | 361/720 |
| 2010/0258841 A1 | 10/2010 | Lidow et al. | |

FOREIGN PATENT DOCUMENTS

| | | |
|---|---|---|
| JP | 2007-19309 | 1/2007 |
| JP | 2008-010461 | 1/2008 |
| JP | 2008-98434 | 4/2008 |
| JP | 2009-76845 | 4/2009 |
| JP | 2009-231508 | 10/2009 |
| JP | 2009-289827 | 12/2009 |
| TW | 548725 | 8/2003 |
| TW | 200414313 | 8/2004 |
| TW | 201030973 | 8/2010 |
| TW | 201143017 | 12/2011 |

OTHER PUBLICATIONS

USPTO, (Sylvia) Notice of Allowance and Notice of Allowability, Sep. 24, 2013, in parent U.S. Appl. No. 13/308,686 [now allowed].
USPTO, (Sylvia) Non-Final Rejection, Jun. 4, 2013, in parent U.S. Appl. No. 13/308,686 [now allowed].
USPTO, (Sylvia) Non-Final Rejection, Jan. 31, 2013, in parent U.S. Appl. No. 13/308,686 [now allowed].
USPTO, (Sylvia) Restriction Requirement, Dec. 6, 2012, in parent U.S. Appl. No. 13/308,686 [now allowed].
First Office Action in CN Application No. 201110415537.0, mailed Apr. 23, 2014, 22 pages.
Taiwan Office Action in corresponding TW Application No. 100145911, mailed Feb. 18, 2014, 7 pages.
Office Action in JP Application No. 2011-032042, mailed Dec. 2, 2014, 2 pages.

\* cited by examiner

SEMICONDUCTOR DEVICE INCLUDING GATE ELECTRODE PROVIDED OVER ACTIVE REGION IN P-TYPE NITRIDE SEMICONDUCTOR LAYER AND METHOD OF MANUFACTURING THE SAME, AND POWER SUPPLY APPARATUS

CROSS-REFERENCE TO RELATED APPLICATION

This application is a divisional of application Ser. No. 13/308,686, filed Dec. 1, 2011, which is based upon and claims the benefit of priority of the prior Japanese Patent Application No. 2011-032042, filed on Feb. 17, 2011, the entire contents of which are incorporated herein by reference.

FIELD

The embodiments discussed herein are related to a semiconductor device and a method of manufacturing the same, and a power supply apparatus.

BACKGROUND

Nitride semiconductor devices are characteristic in terms of their higher saturation electron velocities and wider band gaps. Efforts for developing devices with higher withstanding voltages and higher outputs by exploiting such characteristics have been made actively.

Particularly, one type of nitride semiconductor devices used for such devices with higher withstanding voltages and higher outputs is a field effect transistor, particularly, a high electron mobility transistor (HEMI).

For example, there exists a GaN-HEMI including a HEMI structure, where an AlGaN electron supply layer is stacked on a GaN electron transit layer. In a GaN-HEMI, strain is generated in AlGaN due to the difference in the lattice constants of AlGaN and GaN, which induces piezo polarization. Higher-density two-dimensional electron gas (2DEG) is generated by the piezo polarization and the spontaneous polarization of AlGaN. In this manner, a GaN-HEMI can provide a device with a higher withstanding voltage and a higher output.

Various techniques have also been developed to achieve normally-off operations in a GaN-HEMI which provides higher-density 2DEG.

For example, one technique achieves normally-off operations by etching an electron supply layer right under a gate electrode. Hereinafter, this technique is referred to as a first technique.

Alternatively, (intentionally injects carriers) there are devices which operate based on a principle totally different from junction field-effect transistors (JFETs) in the point that carriers are intentionally injected. Specifically, another technique in the devices achieves normally-off operations by providing a semiconductor layer with p-type conductivity only right under a gate electrode. Hereinafter, this technique is referred to as a second technique. A further technique provides a nitride semiconductor layer including a region with p-type conductivity right under a gate electrode, while providing high-resistance regions in remaining regions. In this technique, a hydrogen barrier film or hydrogen diffusion film is provided on that higher-resistance region. Hereinafter, this technique is referred to as a third technique.

SUMMARY

According to an aspect of the embodiments, the present semiconductor device and power supply apparatus include a nitride semiconductor stacked structure including a carrier transit layer and a carrier supply layer; a p-type nitride semiconductor layer provided over the nitride semiconductor stacked structure and including an active region and an inactive region; an n-type nitride semiconductor layer provided on the inactive region in the p-type nitride semiconductor layer; and a gate electrode provided over the active region in the p-type nitride semiconductor layer.

According to another aspect of the embodiments, the present method of manufacturing a semiconductor device includes forming a nitride semiconductor stacked structure including a carrier transit layer and a carrier supply layer; forming a p-type nitride semiconductor layer over the nitride semiconductor stacked structure; forming an n-type nitride semiconductor layer on the p-type nitride semiconductor layer; removing a portion of the n-type nitride semiconductor layer; forming an active region in a portion of the p-type nitride semiconductor layer by performing a thermal treatment; and forming a gate electrode over the active region in the p-type nitride semiconductor layer.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the above-described first technique described above, however, the etching induces damages in the vicinity of the channel regions, which increases the resistance and the leak current in the channel region.

In the above-described second technique, the semiconductor layer with p-type conductivity formed in the regions other than right under the gate electrode is required to be removed by etching and so forth. This induces damages in the vicinity of the channel regions, resulting in an increased resistance in the channel region.

The above-described third technique has a difficulty in maintaining low resistances in the channel regions.

Accordingly, achieving normally-off operations while maintaining low resistances in the channel regions is desired.

Hereinafter, a semiconductor device and a method of manufacturing the same, and a power supply apparatus according to embodiments will be described with reference to the drawings.

First Embodiment

A semiconductor device and a method of manufacturing the same according to a first embodiment will be described with reference to FIGS. 1-5D.

The semiconductor device according to this embodiment is a compound semiconductor device, particularly, a device with a higher withstanding voltage and a higher output using a nitride semiconductor material. Note that such a semiconductor device is also referred to as a nitride semiconductor device.

Furthermore, this semiconductor device includes a field-effect transistor using a nitride semiconductor material. In the present embodiment, the semiconductor device includes a junction field-effect transistor. Note that this transistor is also referred to as a nitride semiconductor field-effect transistor.

Specifically, the semiconductor device of this embodiment includes a GaN-HEMT using a GaN-based semiconductor material and achieving a normally-off operation. Note that this device is also referred to as a GaN-based device.

Figure 1:
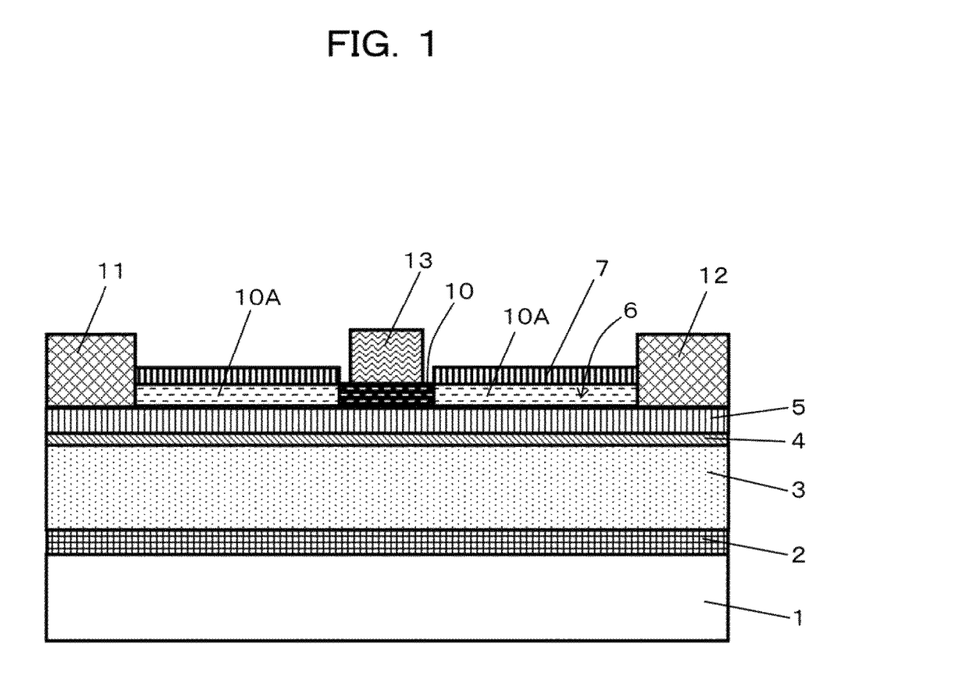
FIG. 1 is a schematic cross-sectional view illustrating the structure of a semiconductor device (GaN-HEMI) according to a first embodiment.

As depicted in FIG. 1, the semiconductor device of this embodiment includes a nitride semiconductor stacked structure, wherein a nucleation layer 2, an i-GaN electron transit layer 3, an i-AlGaN spacer layer 4, and a n-AlGaN electron supply layer 5 is stacked over a semi-insulating SiC substrate 1.

Note that the nitride semiconductor stacked structure is also referred to as a compound semiconductor stacked structure, or GaN-HEMT structure, or AlGaN/GaN-HEMT structure, or GaN-HEMI crystal. The electron transit layer is also referred to as a carrier transit layer. The electron supply layer is also referred to as a carrier supply layer.

Especially, in this semiconductor device, a p-GaN layer 6 and an n-GaN layer 7 are provided over the nitride semiconductor stacked structure as set forth above.

In this embodiment, the p-GaN layer 6 is a GaN layer doped with a p-type impurity, such as Mg, for example, and includes an active region (activated region) 10, wherein the p-type impurity is activated; and the regions other than the active region 10, i.e., inactive regions 10A, wherein the p-type impurity is inactivated by hydrogen incorporation. In other words, in the p-GaN layer 6, the p-type impurity is partially activated. Thus, the active region 10 in the p-GaN layer 6 is a region having a fixed charge, whereas the inactive regions 10A are regions without a fixed charge. In other words, the active region 10 in the p-GaN layer 6 is a region exhibiting p-type conductivity, whereas the inactive regions 10A are regions not exhibiting p-type conductivity. Note that the p-GaN layer 6 is also referred to as a p-type nitride semiconductor layer. The inactive regions 10A in the p-GaN layer 6 are also referred to as an i-GaN layer, since the inactive regions 10A do not exhibit conductivity and have the energy level comparable to the energy level of an undoped GaN layer in the band structure.

The n-GaN layer 7 is a GaN layer doped with an n-type impurity and is provided on the inactive regions 10A in the p-GaN layer 6. In contrast, no n-GaN layer 7 is provided on the active region 10 in the p-GaN layer 6. In other words, the n-GaN layer 7 covers the inactive regions 10A in the p-GaN layer 6, but does not cover the active region 10 in the p-GaN layer 6. Note that the n-GaN layer 7 is also referred to as an n-type nitride semiconductor layer.

The above-described nitride semiconductor stacked structure further includes a source electrode 11, a drain electrode 12, and a gate electrode 13 over the nitride semiconductor stacked structure. In the present embodiment, the source electrode 11 and the drain electrode 12 are provided on the n-AlGaN electron supply layer 5. The gate electrode 13 is provided on the active region 10 in the p-GaN layer 6. Here, the active region 10 in the p-GaN layer 6 and the gate electrode 13 Schottky-contact (Schottky-junction) to each other. Although not illustrated, the surface is covered with a passivation film, such as an SiN film, for example, and interconnections, pads, and the like are also provided.

Figure 2A:
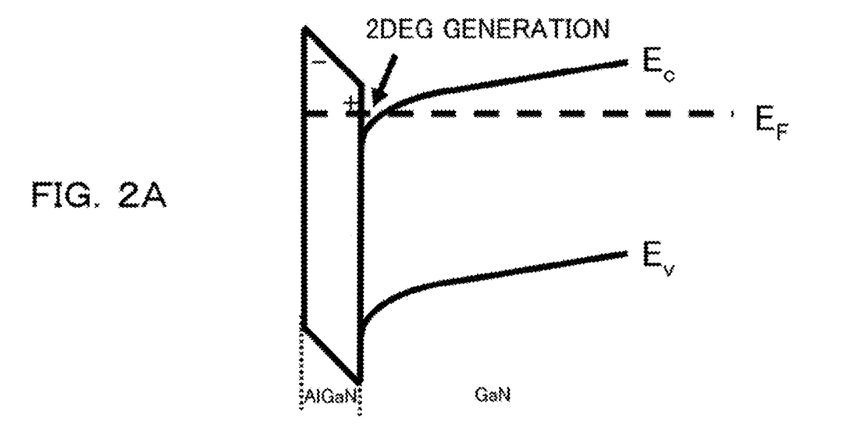
FIG. 2A is a band structure profile of AlGaN/GaN-HEMT.
Figure 2B:
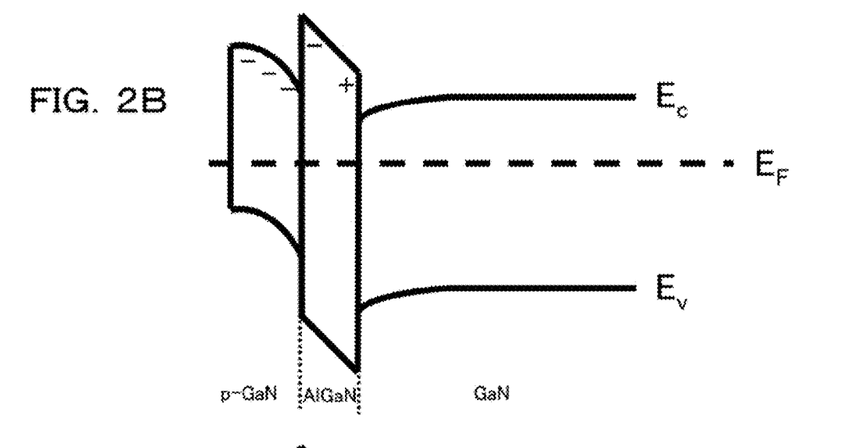
FIG. 2B is a band structure profile where a p-GaN layer (GaN layer with p-type conductivity) is provided on an AlGaN layer right under the gate electrode.

As described above, the semiconductor device of this embodiment includes the p-GaN layer 6 over a channel region of the nitride semiconductor stacked structure, i.e., the region where electrons (carriers) travel, and the gate electrode 13 is provided on the active region 10 of the p-GaN layer 6. In such a structure, the p-GaN layer 6 is depleted in the region under the gate electrode 13, and, as depicted in FIGS. 2A and 2B, the band is elevated by the fixed charges (−) in the p-GaN layer 6. As a result, the energy level $E_C$ of the conduction band in the interface between the GaN layer and the AlGaN layer in the AlGaN/GaN-HEMT structure exceeds the Fermi level $E_F$, suppressing generation of 2DEG, thereby achieving normally-off operations. Note that FIG. 2A illustrates the band structure of the GaN and AlGaN layers in the AlGaN/GaN-HEMT structure, indicating that higher-density 2DEG is generated in the interface between the GaN layer and the AlGaN layer, due to the piezo polarization and spontaneous polarization occurring at the AlGaN layer.

In contrast, the regions 10A in the p-GaN layer 6 other than the active region 10 are not activated, and the n-GaN layer 7 is provided on the non-activated regions (inactive regions) 10A. More specifically, the non-activated regions 10A in the p-GaN layer 6 are provided over the channel region between the drain electrode 12 and the gate electrode 13, and between the source electrode 11 and the gate electrode 13, and the n-GaN layer 7 is provided on the non-activated regions 10A.

The reasons for adopting such a structure will be discussed.

Figure 2C:
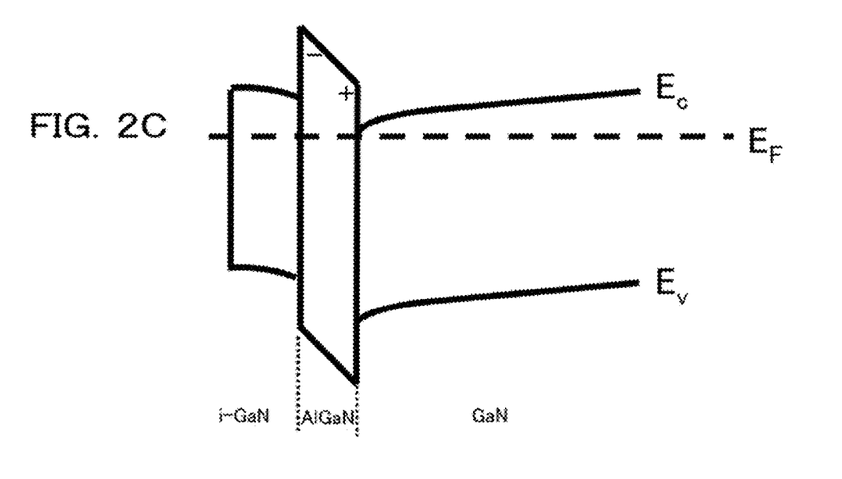
FIG. 2C is a band structure profile where i-GaN is present over the regions other than the region right under the gate electrode, i.e., over the channel region.
Figure 3:
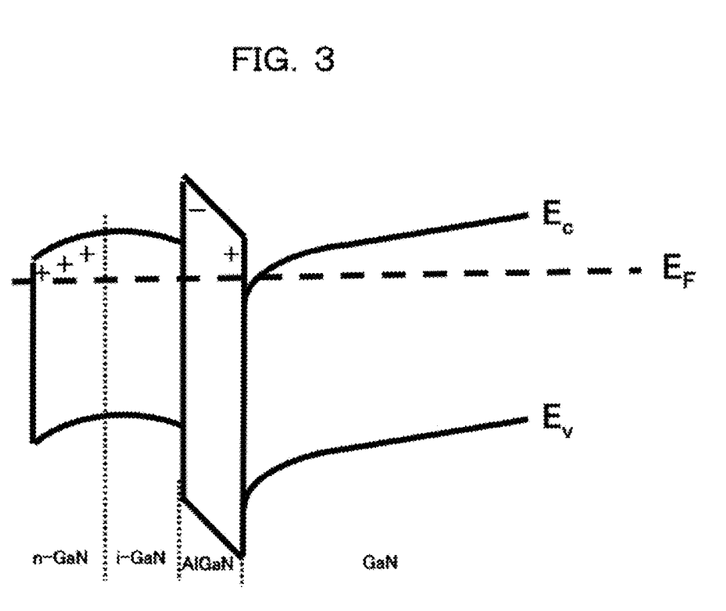
FIG. 3 is a band structure profile of a semiconductor device (GaN-HEMT) according to a first embodiment.

More specifically, the non-activated regions 10A in the p-GaN layer 6, i.e., i-GaN layer, present over the AlGaN/GaN-HEMT structure would elevate the band, as depicted in FIGS. 2A and 2C. This increases the resistance in the channel regions between the drain electrode 12 and the gate electrode 13, and between the source electrode 11 and the gate electrode 13. This results in degrading the device performances. Therefore, the n-GaN layer 7 is provided on the non-activated regions 10A in the p-GaN layer 6, i.e., i-GaN layer, to descend the band, as depicted in FIGS. 2C and 3. More specifically, the band elevated by the i-GaN layer present on the AlGaN/GaN-HEMT structure is descended by fixed charges (+) in the depleted n-GaN layer 7. Thereby, the energy level $E_C$ in the conduction band in the interface between the GaN layer and the AlGaN layer in the AlGaN/GaN-HEMT structure becomes comparable to that in the AlGaN/GaN-HEMT structure without a p-GaN layer 6 and an n-GaN layer 7 (see FIG. 2A). This allows maintaining low resistances in the channel regions between the drain electrode 12 and the gate electrode 13, and between the source electrode 11 and the gate electrode 13.

As described above, by providing the n-GaN layer 7 on the non-activated regions 10A in the p-GaN layer 6 between the drain electrode 12 and the gate electrode 13, and between the source electrode 11 and the gate electrode 13, a low resistance of the channel region can be maintained. In other words, the provision of the p-GaN layer 6 and the n-GaN layer 7 enables normally-off operations, without degrading the device performances.

As will be described later, upon forming the active region 10 in the p-GaN layer 6 during the semiconductor device manufacturing processes, the n-GaN layer 7 functions as a film for preventing hydrogen desorption from the p-GaN layer 6 in remaining regions. This means that the n-GaN layer 7 acts to maintain low resistances in the channel regions, as well as functioning as a hydrogen desorption inhibition film.

As described above, a nitride semiconductor stacked structure, over which a p-GaN layer 6 and the n-GaN layer 7 are stacked, defines a nitride semiconductor stacked structure, as a whole, including the p-GaN layer 6 and the n-GaN layer 7. In such a structure, current collapse phenomena can be also suppressed, since the surface of the nitride semiconductor stacked structure is located farther from the channel region.

Furthermore, as will be described later, for partially activating p-type impurity in the p-GaN layer 6, openings are formed in the n-GaN layer 7 with photo-electrochemical etching, which enables manufacturing of a high-quality device without any damage in the vicinity of the channel regions. Alternatively, if openings are formed in the n-GaN layer 7 with dry etching, the p-GaN layer 6 may be damaged. However, since the p-GaN layer 6 is distant from the channel regions, impacts on the device characteristics is low and low resistances in the channel regions can still be maintained.

As described above, in the present embodiment, the p-type nitride semiconductor layer and the n-type nitride semiconductor layer provided over the nitride semiconductor stacked structure are GaN layers 6 and 7 including the same nitride semiconductor material. Thus, crystal defects are reduced, which also helps to achieve a high-quality device.

Next, a method of manufacturing a semiconductor device according to this embodiment will be described with reference to FIGS. 4A-4C and 5A-5D.

Figure 4A:
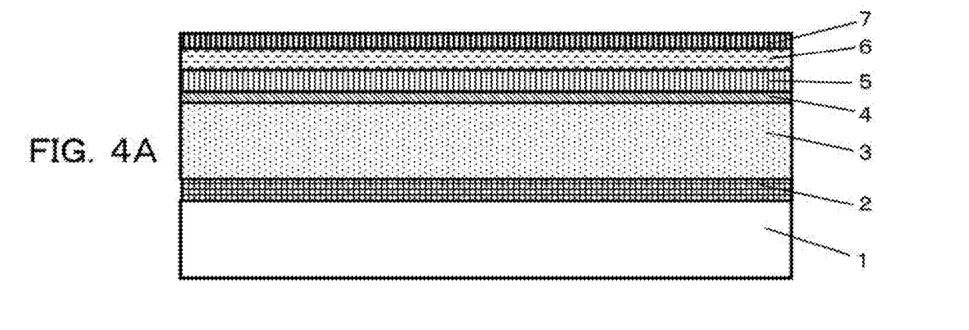
FIGS. 4A to 4C are schematic cross-sectional views illustrating the method of manufacturing the semiconductor device (GaN-HEMT) according to the first embodiment.

Initially, as depicted in FIG. 4A, over a semi-insulating SiC substrate 1, a nucleation layer 2, an i-GaN electron transit layer 3, an i-AlGaN spacer layer 4, an n-AlGaN electron supply layer 5, a p-GaN layer 6, and an n-GaN layer 7 are formed, in sequence, with metal organic vapor phase epitaxy (MOVPE) or the like, for example.

More specifically, a nitride semiconductor stacked structure (GaN-HEMT crystal) including the nucleation layer 2, the i-GaN electron transit layer 3, the i-AlGaN spacer layer 4, and the n-AlGaN electron supply layer 5, is formed over the semi-insulating SiC substrate 1. Subsequently, the p-GaN layer 6 is formed on the nitride semiconductor stacked structure, followed by formation of the n-GaN layer 7 on the p-GaN layer 6. In this manner, the nitride semiconductor stacked structure, the p-GaN layer 6, and the n-GaN layer 7 are successively formed. Furthermore, since a p-type nitride semiconductor layer and an n-type nitride semiconductor layer formed over the nitride semiconductor stacked structure are GaN layers 6 and 7 including the same nitride semiconductor material in this embodiment, crystal defects are reduced, thereby achieving a high-quality device.

Here, the i-GaN electron transit layer 3 has a thickness of about 3 μm, for example. The i-AlGaN spacer layer 4 has a thickness of about 5 nm, for example. The n-AlGaN electron supply layer 5 has a thickness of about 30 nm, for example, where Si is used as an n-type impurity, for example, with a dope concentration of about $5 \times 10^{18}$ cm$^{-3}$, for example. The p-GaN layer 6 has a thickness of about 50 nm, for example, where Mg is used as a p-type impurity, for example, with a dope concentration of about $2 \times 10^{19}$ cm$^{-3}$, for example. The n-GaN layer 7 has a thickness of about 10 nm, for example, where Si is used as an n-type impurity, for example, with a dope concentration of about $5 \times 10^{18}$ cm$^{-3}$, for example.

Figure 4B:
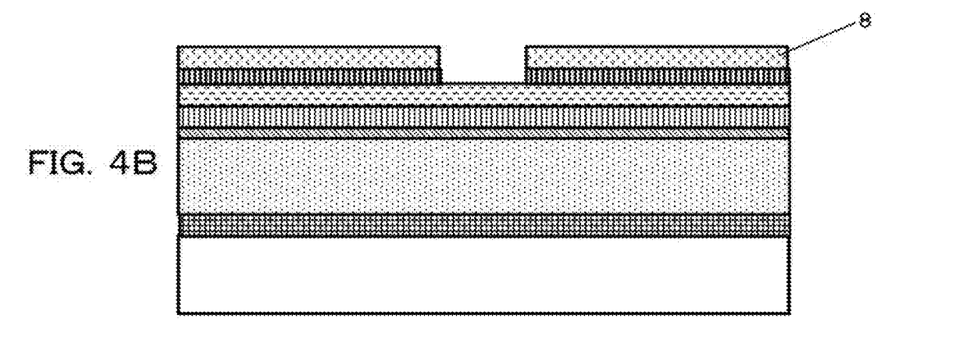

Next, an SiO$_2$ film 8 is formed over the entire surface of the wafer, i.e., over the surface of the n-GaN layer 7, with sputtering, for example. Subsequently, a resist mask (not illustrated) is formed which has an opening in the region to be located under the region where a gate electrode is to be formed (hereinafter, referred to as "gate electrode formation region") with photolithography, for example. The SiO$_2$ film 8 in the region to be located under the gate electrode formation region is removed, as depicted in FIG. 4B. Thus, the SiO$_2$ film 8 is formed on the n-GaN layer 7, which has an opening in the region to be located under the gate electrode formation region. In this process, a portion of the periphery of the SiO$_2$ film 8 (not illustrated), which has been formed over the entire surface, is also removed.

Subsequently, a portion of the n-GaN layer 7 is removed using the SiO$_2$ film 8 as a mask. More specifically, the n-GaN layer 7 in the region to be located under the gate electrode formation region is removed. This provides the n-GaN layer 7 having an opening in the region to be located under the gate electrode formation region.

In the present embodiment, only the n-GaN layer 7 is selectively removed with photo-electrochemical (PEC) etching. During this etching, an electrode is connected to the n-GaN layer 7 exposed at the periphery of the wafer, and the wafer is immersed into a potassium hydroxide (KOH) aqueous solution while applying ultraviolet radiation. The ultraviolet radiation has a wavelength shorter than the wavelength corresponding to the band gap of GaN. As a result, electron-hole pairs are generated in GaN. The electrons are drawn by the applied bias and remained holes migrate toward the surface of GaN. The surface of GaN is etched in repeated cycles of oxidation and dissolution by a reaction with OH$^-$ ions in the KOH aqueous solution. In this manner, since only the n-GaN layer 7 is selectively removed without causing any damage to the p-GaN layer 6, a high-quality normally-off type device (normally-off type GaN-HEMT) is achieved without any damage in the vicinity of the channel regions.

While the n-GaN layer 7 is removed with the photo-electrochemical etching in the above example, this is not limiting. For example, the n-GaN layer 7 may be removed with dry etching. In this case, the p-GaN layer 6 may be damaged. However, since the p-GaN layer 6 is distant from the channel regions, impacts on the device characteristics is low and low resistances in the channel regions can still be maintained.

Figure 4C:
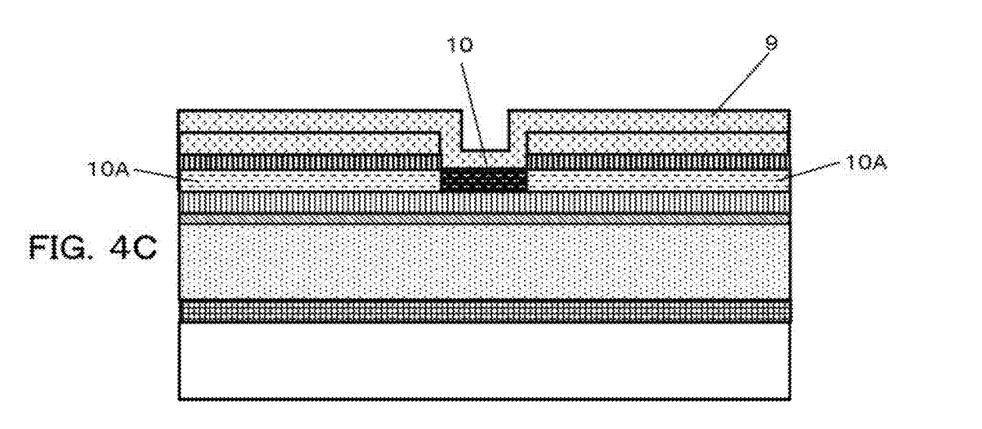

Subsequently, a SiO$_2$ film (protection film) 9 is formed on the entire surface of the wafer, i.e., the surface the p-GaN layer 6 in the region to be located under the gate electrode formation region, the side of the n-GaN layer 7, and the surface of the SiO$_2$ film 8, with sputtering, for example, as depicted in FIG. 4C. Stated differently, the entire surface is covered with the SiO$_2$ film 9.

By covering the surfaces of the p-GaN layer 6 and the n-GaN layer 7 with the SiO$_2$ film 9 as a protection film, before a thermal treatment for defining an active region 10, which will be described later, desorption (vaporization) of nitrogen from GaN during the thermal treatment is prevented. Therefore, the SiO$_2$ film 9 as a protection film is also referred to as a nitrogen desorption inhibition film. Since the SiO$_2$ film 9 permeates hydrogen, it does not act as a hydrogen desorption inhibition film.

Subsequently, a thermal treatment is carried out, to activate the p-type impurity (here, Mg) in a portion of the p-GaN layer 6, i.e., the p-GaN layer 6 in the region to be located under the gate electrode formation region, thereby defining an active region 10 in that portion of the p-GaN layer 6. Note that this thermal treatment is also referred to as an impurity activation treatment.

For example, a thermal treatment between about 600° C. and about 1000° C. (e.g., at about 750° C.) is performed in a nitrogen atmosphere, to activate the p-type impurity in the p-GaN layer 6 in the region to be located under the gate electrode formation region, thereby defining the active region 10 in the p-GaN layer 6.

As described above, the n-GaN layer 7 formed on the p-GaN layer 6 has the opening in the region to be located under the gate electrode formation region. More specifically, the p-GaN layer 6 in the region to be located under the gate electrode formation region is not covered with the n-GaN layer 7, whereas the other regions are covered with the n-GaN layer 7. Note that p-type impurity (here, Mg) in the p-GaN layer 6 is inactive due to the presence of hydrogen, which has been included upon forming the p-GaN layer 6.

When this structure undergoes a thermal treatment, the n-GaN layer 7 prevents hydrogen desorption from the p-GaN layer 6 in the region covered with the n-GaN layer 7, i.e., the p-GaN layer 6 in the regions other than the region to be located under the gate electrode formation region. As a result, the p-type impurity doped to the p-GaN layer 6 are not activated in the region covered with the n-GaN layer 7, and remain inactive. In contrast, hydrogen desorption from the p-GaN layer 6 and the p-type impurity doped to the p-GaN layer 6 are activated in the region not covered with the n-GaN layer 7, i.e., the p-GaN layer 6 in the region to be located under the gate electrode formation region. As described above, by covering the p-GaN layer 6 in the regions other than the region to be located under the gate electrode formation region, with the n-GaN layer 7, only the p-type impurity doped to the p-GaN layer 6 in the region to be located under the gate electrode formation region can be selectively activated. More specifically, by covering the p-GaN layer 6 in the regions other than the region to be located under the gate electrode formation region, with the n-GaN layer 7, the active region 10 is defined only in the p-GaN layer 6 in the region to be located under the gate electrode formation region, while defining other regions as the inactive regions 10A. In this case, the n-GaN layer 7 functions as a film for preventing hydrogen desorption from the p-GaN layer 6, or a film for preventing activation of the p-GaN layer 6. Therefore, the n-GaN layer 7 is also referred to as a hydrogen desorption inhibition film or activation inhibition film.

Figure 5A:
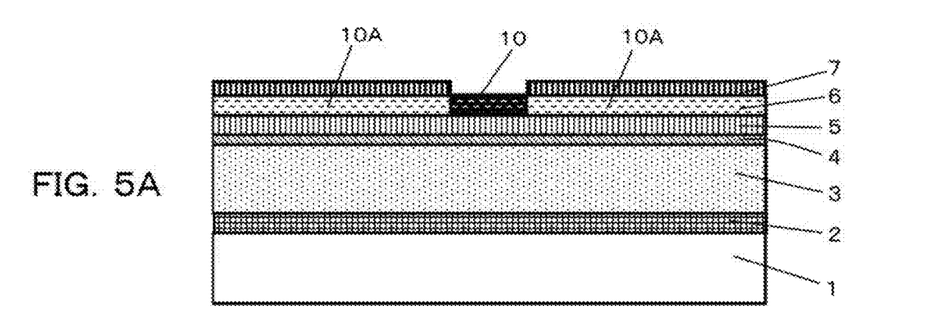
FIGS. 5A to 5D are schematic cross-sectional views illustrating the method of manufacturing the semiconductor device (GaN-HEMT) according to the first embodiment.

After performing the thermal treatment as described above, the SiO$_2$ films 8 and 9 are removed with wet etching, for example, as depicted in FIG. 5A.

Subsequently, while not illustrated, a resist mask having an opening in an element isolation region is formed with photolithography, for example, and an element isolation is established, using this mask, with dry etching with a chlorine-based gas, or ion implant, for example.

Figure 5B:
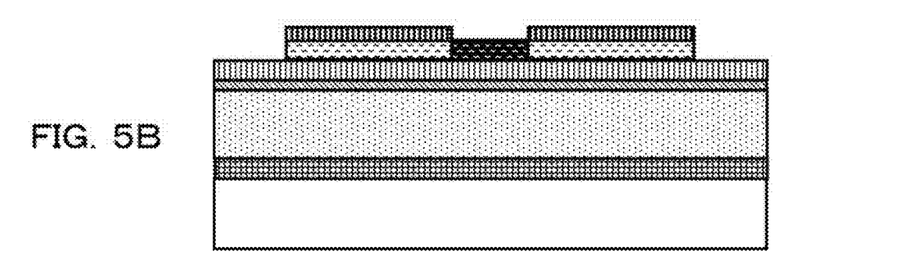

Subsequently, a resist mask (not illustrated) having respective openings in regions where source and drain electrodes are to be formed, is formed using photolithography, for example. Then, the p-GaN layer 6 and the n-GaN layer 7 in the regions where source and drain electrodes are to be formed are removed using this resist mask, with dry etching with a chlorine-based gas, for example, as depicted in FIG. 5B.

Figure 5C:
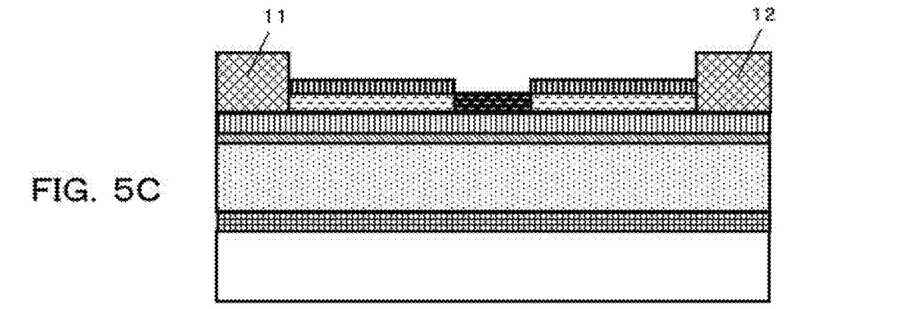

Subsequently, a source electrode 11 and a drain electrode 12 are formed in the regions where source and drain electrodes are to be formed, respectively, with photolithography and evaporation and lift-off techniques, for example, as depicted in FIG. 5C. More specifically, on the n-AlGaN electron supply layer 5, the source electrode 11 and the drain electrode 12 made from Ta/Al layers are forming by stacking Ta and Al in sequence. In this embodiment, the thickness of Ta may be about 20 nm, for example, and the thickness of Al may be about 200 nm, for example. Thereafter, the ohmic contact characteristic is established by performing a thermal treatment between about 400° C. and about 1000° C. (e.g., at 550° C.) in a nitrogen atmosphere, for example.

Figure 5D:
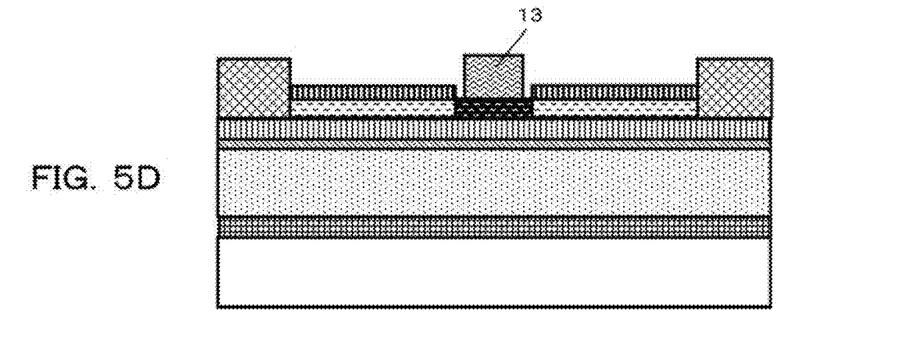

Subsequently, a gate electrode 13 is formed in the gate electrode formation region, with photolithography and evaporation and lift-off techniques, for example, as depicted in FIG. 5D. More specifically, the gate electrode 13 made from Ni/Al is formed by stacking Ni and Au in sequence, on the active region 10 in the p-GaN layer 6. In this embodiment, the thickness of Ni may be about 30 nm, for example, and the thickness of Au may be about 400 nm, for example. In the above processes, the gate electrode 13 Schottky-contacting to the active region 10 in the p-GaN layer 6 is formed. In this manner, normally-off operations can be achieved by forming the gate electrode 13 on the active region 10 in the p-GaN layer 6.

Thereafter, although not illustrated, the surface is covered with a passivation film, such as an SiN film, for example, and interconnections, pads, and the like are also formed, to manufacture a semiconductor device (GaN-HEMT).

As described above, the semiconductor device and the method of manufacturing the same according to this embodiment are advantageous in that normally-off operations can be achieved while maintaining low resistances in the channel regions.

While the p-GaN layer 6 and the n-GaN layer 7 are provided over the nitride semiconductor stacked structure in the above-described embodiment, this is not limiting. Any suitable p-type nitride semiconductor layer and n-type nitride semiconductor layer may be provided over the nitride semiconductor stacked structure. Here, the p-type nitride semiconductor layer may be any suitable layer including a GaN, AlN or InN crystal, or a mixed crystal thereof, and the n-type nitride semiconductor layer may be any suitable layer including a GaN, AlN or InN crystal, or a mixed crystal thereof. For example, the p-type nitride semiconductor layer may be any suitable layer including nitride semiconductor materials, such as AlGaN, InAlN, InGaN, InN, and AlInGaN. Furthermore, the n-type nitride semiconductor layer may be any suitable layer including a nitride semiconductor material, such as AlGaN, InAlN, InGaN, InN, and AlInGaN. When the p-type nitride semiconductor layer and the n-type nitride semiconductor layer include the same nitride semiconductor material, crystal defects is reduced, which reduces the resistance and current collapse, thereby achieving a high-quality device.

Figure 6:
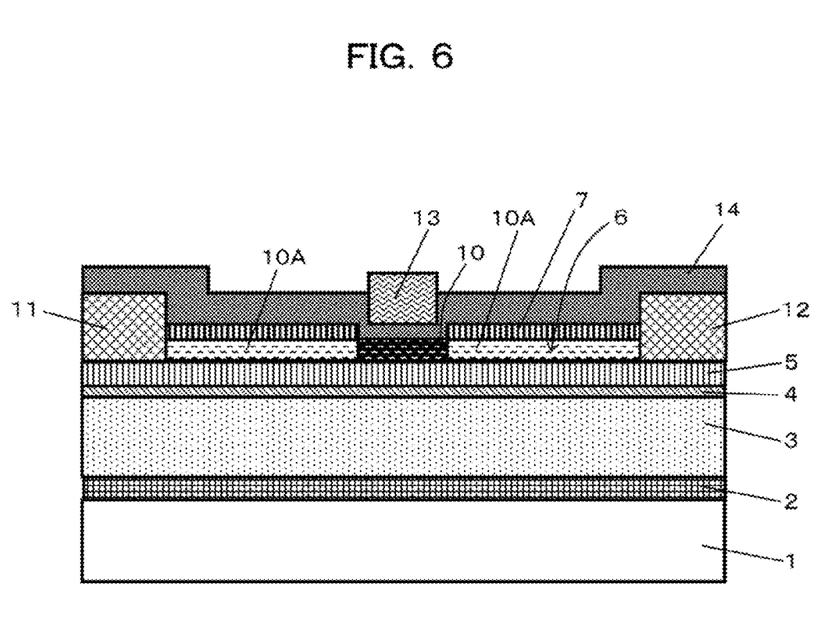
FIG. 6 is a schematic cross-sectional view illustrating the structure of a semiconductor device (GaN-HEMT) according to a variant of the first embodiment.

Furthermore, while the gate electrode 13 is formed on the active region 10 in the p-GaN layer 6 in the above-described embodiment, this is not limiting. The gate electrode 13 may be provided over the active region 10. More specifically, the above-described embodiment has been described in an junction field-effect transistor wherein the gate electrode 13 Schottky-contacts to the active region 10 in the p-GaN layer 6, this is not limiting. For example, as depicted in FIG. 6, the embodiment may be configured as a metal insulator semiconductor (MIS)-type field-effect transistor where a gate insulation film 14 is provided between the gate electrode 13 and the active region 10 in the p-GaN layer 6. In FIG. 6, the same elements as those in the above-described embodiment (see FIG. 1) are referenced by the like reference symbols.

For an MIS-type field-effect transistor, in the method of manufacturing a semiconductor device according to the above-described embodiment, after forming a source electrode 11 and a drain electrode 12 and performing a thermal treatment for establishing the ohmic contact characteristic, before forming the gate electrode 13, a gate insulation film 14 may be formed.

For example, a gate insulation film 14 may be formed on the entire surface of the wafer, i.e., the surface of the active region 10 in the p-GaN layer 6, the surface of the n-GaN layer 7, and the surfaces of the source electrode 11 and the drain electrode 12. Then, a gate electrode 13 may be formed on the gate insulation film 14, in the manner similar to the above-described embodiment.

Note that the gate insulation film 14 may have a thickness from about 2 nm to about 200 nm, e.g., about 10 nm. Furthermore, the gate insulation film 14 may be formed using an ALD, plasma CVD, and sputtering techniques, for example. For example, an oxide, a nitride, or an oxinitride of Si, Al, Hf, Zr, Ti, Ta, and W, may be used as the material for the gate insulation film 14. For example, the gate insulation film 14 may be an AlO film.

Furthermore, the nitride semiconductor stacked structure is not limited to the one in the above-described embodiment, any other nitride semiconductor stacked structures may also be used, as long as the nitride semiconductor stacked structure includes a carrier transit layer and a carrier supply layer. For example, a nitride semiconductor stacked structure which may be used to construct a field-effect transistor, such as a field-effect transistor, using a nitride semiconductor, may be used. For example, the material of the nitride semiconductor stacked structure may be any material including a GaN, AlN or InN crystal, or a mixed crystal thereof. Note that the nitride semiconductor stacked structure is also referred to as a semiconductor epitaxial structure.

Furthermore, while a SiC substrate is used in the above-described embodiment, this is not limiting. For example, other semiconductor substrates, such as a sapphire substrate, a Si substrate and a GaN substrate, may also be used. Furthermore, while a semi-insulating substrate is used in the above-described embodiment, this is not limiting. For example, a substrate with n-type or p-type conductivity may also be used.

Furthermore, the layer structures of the source, drain, and gate electrodes in the above-described embodiment are not limited to the specific layer structures in the above-described embodiment, and any other layer structures may also be used. For example, the layer structures of the source, drain, and gate electrodes in the above-described embodiment may be single-layered or multi-layered. Furthermore, the techniques of forming the source, drain, and gate electrodes are only exemplary, and any other techniques may also be used.

Furthermore, for example, although a thermal treatment is performed for establishing the ohmic contact characteristics of the source and drain electrodes in the above-described embodiment, this is not limiting. A thermal treatment for establishing the ohmic contact characteristics of the source and drain electrodes may be omitted, as long as the ohmic contact characteristics can be established without a thermal treatment. Furthermore, while the gate electrode undergoes no thermal treatment in the above-described embodiment, a thermal treatment may be performed on the gate electrode.

Second Embodiment

Next, a semiconductor device and a method of manufacturing the same and a power supply apparatus according to a second embodiment will be described with reference to FIGS. 7 and 8.

The semiconductor device according to the present embodiment is a semiconductor package including, as a semiconductor chip, a semiconductor device (GaN-HEMT) according to any one of the above-described first embodiment and its variants. Note that such a semiconductor chip is also referred to as a HEMT chip.

Hereinafter, the embodiment will be described with reference to a discrete package, as an example.

Figure 7:
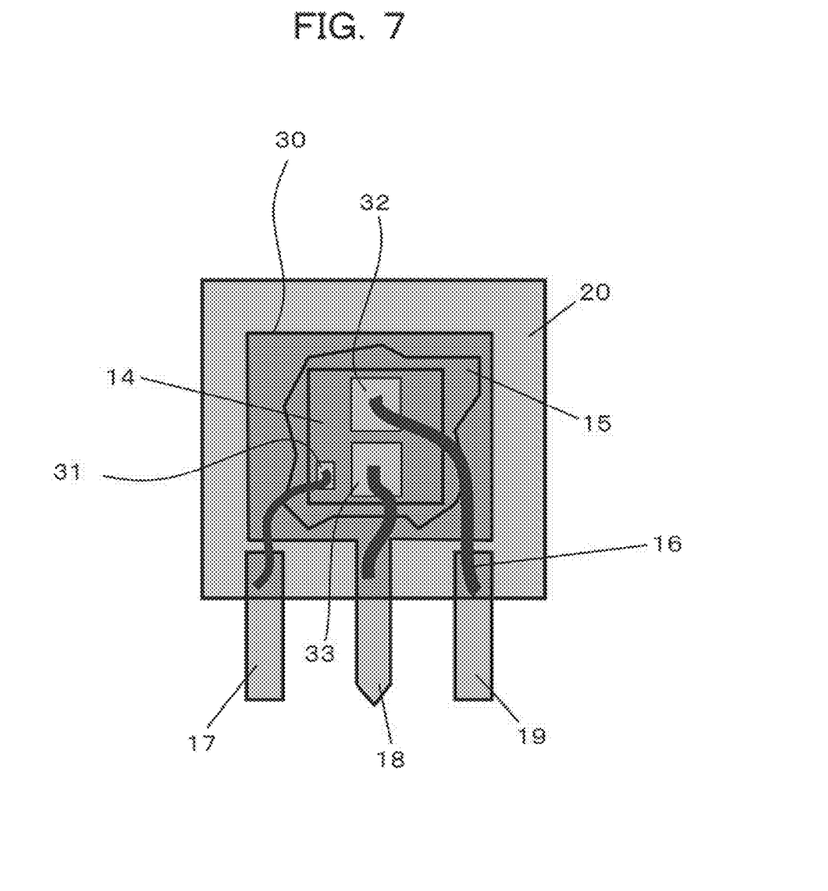
FIG. 7 is a schematic plan view illustrating the structure of a semiconductor device (semiconductor package) according to a second embodiment.

As depicted in FIG. 7, this semiconductor device includes a stage 30 mounting a semiconductor chip 14 according to any one of the above-described first embodiment and its variants, a gate lead 17, a source lead 19, a drain lead 18, bonding wires 16 (Al wires, in this embodiment), and an encapsulation resin 20. Note that the encapsulation resin is also referred to as a molding resin.

The gate pad 31, the source pad 32, and the drain pad 33 in the semiconductor chip 14 mounted on the stage 30 are connected to the gate lead 17, the source lead 19 and the drain lead 18 through the Al wires 16, respectively, which then undergoes resin encapsulation.

In this embodiment, the stage 30, to which the back face of the substrate in the semiconductor chip 14 is secured with a die attach material 15 (solder, in this embodiment), is electrically connected to the drain lead 18. Note that the configuration is not limited to the one described above, and the stage 30 may be electrically connected to the source lead 19.

Next, a method of manufacturing the semiconductor device (discrete package) according to the present embodiment will be described.

Initially, a semiconductor chip 14 (GaN-HEMT) according to any one of the above-described first embodiment and its variants is secured on the stage 30 of a lead frame, with the die attach material 15 (solder, in this embodiment), for example.

Subsequently, the gate pad 31, the drain pad 33, and the source pad 32 in the semiconductor chip 14 are connected to the gate lead 17, the drain lead 18, and the source lead 19, through bonding with the Al wires 16, respectively, for example.

After resin encapsulation using the transfer mold technique, for example, the lead frame is separated.

The semiconductor device according to the present embodiment (discrete package) may be fabricated in the steps set forth above.

While this embodiment has been described with reference to the discrete package wherein the pads 31-33 in the semiconductor chip 14 are used as bonding pads for wire bonding in this embodiment, this is not limiting and other semiconductor packages may also be used. For example, a semiconductor package may be used wherein pads in the semiconductor chip are used as bonding pads for wireless bonding, such as flip chip bonding, for example. A wafer level package may also be used. Alternatively, semiconductor packages other than a discrete package may also be used.

Next, a power supply apparatus including a semiconductor package including the above-described GaN-HEMI will be described with reference to FIG. 8.

Hereinafter, an embodiment will be described with reference to an example wherein a GaN-HEMI (see FIG. 1) included in the above-described semiconductor package is used in a power factor correction (PFC) circuit provided in a power supply apparatus for a server.

Figure 8:
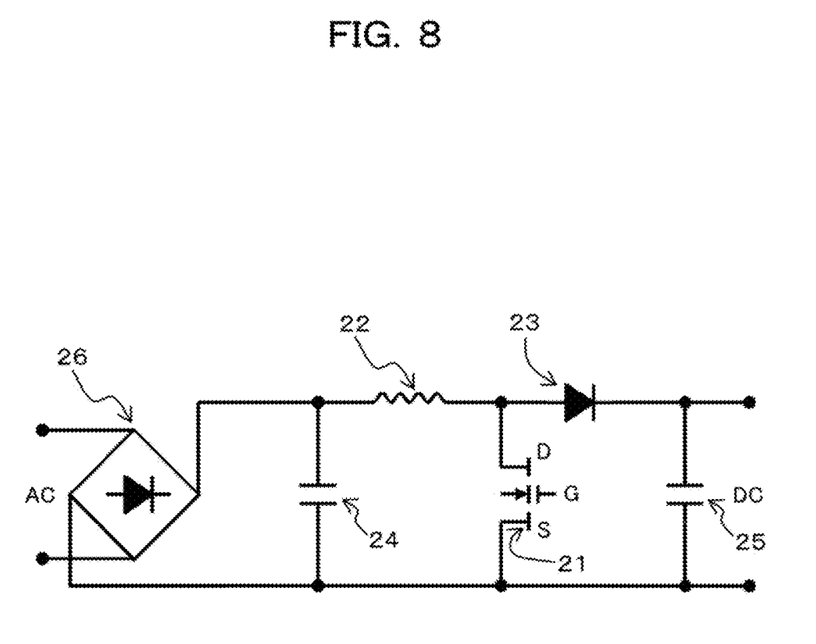
FIG. 8 is a schematic view illustrating the structure of a PFC circuit included in a power supply apparatus according to the second embodiment.

As depicted in FIG. 8, this PFC circuit includes diode bridge 26, a choke coil 22, a first capacitor 24, a GaN-HEMI 21 included in the above-described semiconductor package, a diode 23, and a second capacitor 25.

In this embodiment, this PFC circuit is configured to include the diode bridge 26, the choke coil 22, the first capacitor 24, the GaN-HEMI 21 included in the above-described semiconductor package, the diode 23, and the second capacitor 25, mounted over a circuit substrate.

In the present embodiment, the drain lead 18, the source lead 19, and the gate lead 17 in the above-described semiconductor package are inserted into a drain lead slot, a source lead slot and a gate lead slot in the circuit substrate, respectively, and are then secured with solder, for example. In this manner, the GaN-HEMI 21 included in the above-described semiconductor package is connected to the PFC circuit formed on the circuit substrate.

In this PFC circuit, one terminal of the choke coil 22 and the anode terminal of the diode 23 are connected to the drain electrode D in the GaN-HEMT 21. One terminal of the first capacitor 24 is connected to the other terminal of the choke coil 22, and one terminal of the second capacitor 25 is connected to the cathode terminal of the diode 23. The other terminal of the first capacitor 24, the source electrode S in the GaN-HEMT 21 and the other terminal of the second capacitor 25 are grounded. A pair of terminals of the diode bridge 26 is connected to the two terminals of the first capacitor 24, and the other pair of terminals of the diode bridge 26 is connected to input terminals for receiving an alternating current (AC) voltage. The two terminals of the second capacitor 25 are connected to output terminals for outputting a direct current (DC) voltage. A gate driver, which is not illustrated, is connected to the gate electrode G in the GaN-HEMT 21. In this PFC circuit, by activating the GaN-HEMT 21 by the gate driver, an AC voltage received through the input terminals is converted into a DC voltage, which is output from the output terminals.

Accordingly, the power supply apparatus according to the present embodiment has an advantage of improving the reliability. More specifically, since this power supply apparatus has a semiconductor chip 56 according to any one of the above-described first embodiment and its variants, a reliable power supply apparatus can be constructed.

While the above-described embodiment has been described wherein the above-described semiconductor device (GaN-HEMI or semiconductor package including a GaN-HEMI) is used in a PFC circuit provided in a power supply apparatus for a server, this is not limiting. For example, the above-described semiconductor device (GaN-HEMI or semiconductor package including a GaN-HEMI) may also be used in electronic appliances (electronic apparatuses), such as non-server computers. Alternatively, the above-described semiconductor device (semiconductor package) may also be used for other circuits provided in a power supply apparatuses (e.g., DC-DC converters).

All examples and conditional language recited herein are intended for pedagogical purposes to aid the reader in understanding the invention and the concepts contributed by the inventor to furthering the art, and are to be construed as being without limitation to such. For example recited examples and conditions, nor does the organization of such examples in the specification relate to a illustrating of the superiority and inferiority of the invention. Although the embodiments have been described in detail, it should be understood that the various changes, substitutions, and alterations could be made hereto without departing from the spirit and scope of the invention.

What is claimed is:

1. A semiconductor device comprising:
   a nitride semiconductor stacked structure comprising a carrier transit layer and a carrier supply layer;
   a p-type nitride semiconductor layer provided over the nitride semiconductor stacked structure and comprising an active region and an inactive region;
   an n-type nitride semiconductor layer provided on the inactive region in the p-type nitride semiconductor layer; and
   a gate electrode provided over the active region in the p-type nitride semiconductor layer;
   wherein
   the n-type nitride semiconductor layer is depleted, causing it to have fixed positive charges, and the fixed positive charges in the n-type nitride semiconductor layer cause a conduction band energy level at an interface between the carrier transit layer and the carrier supply layer to be comparable to that in a similar structure which lacks the p-type nitride semiconductor layer and the n-type nitride semiconductor layer.

2. The semiconductor device according to claim 1, wherein the active region is a region having a fixed charge, and the inactive region is a region without a fixed charge.

3. The semiconductor device according to claim 1, wherein the p-type nitride semiconductor layer and the n-type nitride semiconductor layer include a same nitride semiconductor material.

4. The semiconductor device according to claim 1, wherein the p-type nitride semiconductor layer includes a GaN, AlN or InN crystal, or a mixed crystal thereof, and the n-type nitride semiconductor layer includes a GaN, AlN or InN crystal, or a mixed crystal thereof.

5. The semiconductor device according to claim 1, wherein the p-type nitride semiconductor layer is a p-type GaN layer, and the n-type nitride semiconductor layer is an n-type GaN layer.

6. The semiconductor device according to claim 1, wherein the active region in the p-type nitride semiconductor layer and the gate electrode Schottky-contact.

7. The semiconductor device according to claim 1, further comprising a gate insulation film between the active region in the p-type nitride semiconductor layer and the gate electrode.

8. The semiconductor device according to claim 1, wherein the nitride semiconductor stacked structure includes a GaN, AlN or InN crystal, or a mixed crystal thereof.

9. A semiconductor device comprising:
   a stage mounting a semiconductor chip comprising: a nitride semiconductor stacked structure comprising a carrier transit layer and a carrier supply layer; a p-type nitride semiconductor layer provided over the nitride semiconductor stacked structure and comprising an active region and an inactive region; an n-type nitride semiconductor layer provided on the inactive region in the p-type nitride semiconductor layer; and a gate electrode provided over the active region in the p-type nitride semiconductor layer;
   a gate lead connected to the gate pad in the semiconductor chip;
   a source lead connected to the source pad in the semiconductor chip;
   a drain lead connected to the drain pad in the semiconductor chip; and
   an encapsulation resin;
   wherein
   the n-type nitride semiconductor layer is depleted, causing it to have fixed positive charges, and the fixed positive charges in the n-type nitride semiconductor layer cause a conduction band energy level at an interface between the carrier transit layer and the carrier supply layer to be comparable to that in a similar structure which lacks the p-type nitride semiconductor layer and the n-type nitride semiconductor layer.

10. The semiconductor device according to claim 9, wherein the active region is a region having a fixed charge, and the inactive region is a region without a fixed charge.

11. The semiconductor device according to claim 9, wherein the p-type nitride semiconductor layer and the n-type nitride semiconductor layer include a same nitride semiconductor material.

12. The semiconductor device according to claim 9, wherein the p-type nitride semiconductor layer includes a GaN, AlN or InN crystal, or a mixed crystal thereof, and the n-type nitride semiconductor layer includes a GaN, AlN or InN crystal, or a mixed crystal thereof.

13. The semiconductor device according to claim 9, wherein the p-type nitride semiconductor layer is a p-type GaN layer, and the n-type nitride semiconductor layer is an n-type GaN layer.

14. The semiconductor device according to claim 9, wherein the active region in the p-type nitride semiconductor layer and the gate electrode Schottky-contact.

15. The semiconductor device according to claim 9, further comprising a gate insulation film between the active region in the p-type nitride semiconductor layer and the gate electrode.

16. The semiconductor device according to claim 9, wherein the nitride semiconductor stacked structure includes a GaN, AlN or InN crystal, or a mixed crystal thereof.

17. A power supply apparatus comprising:
a semiconductor device comprising:
a nitride semiconductor stacked structure comprising a carrier transit layer and a carrier supply layer;
a p-type nitride semiconductor layer provided over the nitride semiconductor stacked structure and comprising an active region and an inactive region;
an n-type nitride semiconductor layer provided on the inactive region in the p-type nitride semiconductor layer; and
a gate electrode provided over the active region in the p-type nitride semiconductor layer;
wherein
the n-type nitride semiconductor layer is depleted, causing it to have fixed positive charges, and the fixed positive charges in the n-type nitride semiconductor layer cause a conduction band energy level at an interface between the carrier transit layer and the carrier supply layer to be comparable to that in a similar structure which lacks the p-type nitride semiconductor layer and the n-type nitride semiconductor layer.

18. The semiconductor device according to claim 17, wherein the active region is a region having a fixed charge, and the inactive region is a region without a fixed charge.

19. The semiconductor device according to claim 17, wherein the p-type nitride semiconductor layer and the n-type nitride semiconductor layer include a same nitride semiconductor material.

20. The semiconductor device according to claim 17, wherein the p-type nitride semiconductor layer includes a GaN, AlN or InN crystal, or a mixed crystal thereof, and the n-type nitride semiconductor layer includes a GaN, AlN or InN crystal, or a mixed crystal thereof.

21. The semiconductor device according to claim 17, wherein the p-type nitride semiconductor layer is a p-type GaN layer, and the n-type nitride semiconductor layer is an n-type GaN layer.

22. The semiconductor device according to claim 17, wherein the active region in the p-type nitride semiconductor layer and the gate electrode Schottky-contact.

23. The semiconductor device according to claim 17, further comprising a gate insulation film between the active region in the p-type nitride semiconductor layer and the gate electrode.

24. The semiconductor device according to claim 17, wherein the nitride semiconductor stacked structure includes a GaN, AN or InN crystal, or a mixed crystal thereof.

* * * * *

UNITED STATES PATENT AND TRADEMARK OFFICE
CERTIFICATE OF CORRECTION

| | | |
|---|---|---|
| PATENT NO. | : 9,006,787 B2 | Page 1 of 1 |
| APPLICATION NO. | : 14/067928 | |
| DATED | : April 14, 2015 | |
| INVENTOR(S) | : Atsushi Yamada | |

It is certified that error appears in the above-identified patent and that said Letters Patent is hereby corrected as shown below:

Claims

In Claim 24, column 14, line 38: please delete "AN" and insert --AlN--.

Signed and Sealed this
Sixth Day of October, 2015

Michelle K. Lee
*Director of the United States Patent and Trademark Office*